US 12,127,376 B2

(12) United States Patent
Guo

(10) Patent No.: US 12,127,376 B2
(45) Date of Patent: Oct. 22, 2024

(54) HEAT SINK, BOARD, ELECTRONIC DEVICE, AND MANUFACTURING METHOD

(71) Applicant: Huawei Technologies Co., Ltd., Shenzhen (CN)

(72) Inventor: Zhigang Guo, Beijing (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 198 days.

(21) Appl. No.: 17/883,710

(22) Filed: Aug. 9, 2022

(65) Prior Publication Data

US 2022/0394875 A1    Dec. 8, 2022

Related U.S. Application Data

(63) Continuation of application No. PCT/CN2021/075735, filed on Feb. 7, 2021.

(30) Foreign Application Priority Data

Feb. 10, 2020  (CN) .......................... 202010085141.3
Mar. 13, 2020  (CN) .......................... 202010177372.7

(51) Int. Cl.
    *H05K 7/20*    (2006.01)
    *F28F 3/04*    (2006.01)

(52) U.S. Cl.
    CPC ............. *H05K 7/2039* (2013.01); *F28F 3/04* (2013.01)

(58) Field of Classification Search
    CPC ....................... H05K 7/2039; H05K 7/2049
    See application file for complete search history.

(56) References Cited

U.S. PATENT DOCUMENTS

| | | | | |
|---|---|---|---|---|
| 4,138,692 A | * | 2/1979 | Meeker ............... | H01L 23/4332 257/E23.091 |
| 4,156,458 A | * | 5/1979 | Chu ..................... | H01L 23/473 257/E23.098 |
| 4,254,431 A | * | 3/1981 | Babuka ............... | H01L 23/4338 257/713 |
| 4,279,292 A | * | 7/1981 | Swiatosz ............. | H04N 23/54 257/722 |
| 4,561,011 A | * | 12/1985 | Kohara ................ | H01L 23/367 257/772 |
| 4,729,060 A | * | 3/1988 | Yamamoto .......... | H01L 23/4336 257/E23.091 |

(Continued)

FOREIGN PATENT DOCUMENTS

| CN | 106354229 A | 1/2017 |
|---|---|---|
| CN | 107191816 A | 9/2017 |
| CN | 110719717 A | 1/2020 |

*Primary Examiner* — Adrian S Wilson
(74) *Attorney, Agent, or Firm* — Conley Rose, P.C.

(57) ABSTRACT

A heat sink includes a heat sink fin (HSF), a first heat sink plate (HSP), and a second HSP that is opposite to the first HSP. The HSF is located on the first HSP. The second HSP is flexible. Further, an elastic component is disposed between the first HSP and the second HSP. The second HSP is in contact with a heat source component (HSC). Thus, when the heat sink is placed on the HSC, the second HSP contacts the HSC, the second HSP is deformed because the heat sink and the HSC are pressed against each other, and the elastic component between the first HSP and the second HSP is compressed such that heat generated by the HSC is transferred to the heat sink.

20 Claims, 1 Drawing Sheet

(56) References Cited

U.S. PATENT DOCUMENTS

| | | | | |
|---|---|---|---|---|
| 4,928,207 A * | 5/1990 | Chrysler | ............... | H01L 23/427 257/E23.093 |
| 5,247,425 A * | 9/1993 | Takahasi | ............. | H01L 23/4338 174/16.3 |
| 5,500,556 A * | 3/1996 | Kosugi | .................. | H01L 23/66 257/E23.09 |
| 5,527,604 A * | 6/1996 | Hayashi | ............. | H01L 23/3737 428/209 |
| 5,801,330 A * | 9/1998 | Gademann | .......... | B60R 16/0239 174/559 |
| 5,907,189 A * | 5/1999 | Mertol | ................. | H01L 23/367 257/796 |
| 6,292,369 B1 | 9/2001 | Daves | .................... | H01L 21/50 165/185 |
| 6,332,946 B1 * | 12/2001 | Emmett | ............ | H01L 21/67356 257/726 |
| 6,391,442 B1 * | 5/2002 | Duvall | ................... | F28D 20/02 428/407 |
| 6,462,952 B1 * | 10/2002 | Ubukata | ............. | H01L 23/3672 165/185 |
| 6,504,723 B1 * | 1/2003 | Fitzgerald | .......... | H01L 23/3675 257/713 |
| 6,667,548 B2 * | 12/2003 | O'Connor | .......... | H01L 23/3735 257/796 |
| 6,845,014 B2 * | 1/2005 | Wakabayashi | ... | G06K 19/07741 361/737 |
| 7,023,699 B2 * | 4/2006 | Glovatsky | .......... | H05K 7/20454 361/708 |
| 7,030,485 B2 * | 4/2006 | Houle | ................ | H01L 23/3736 257/714 |
| 7,086,458 B2 * | 8/2006 | Chen | ..................... | H01L 23/427 257/E23.09 |
| 7,199,467 B2 * | 4/2007 | Yoshimura | .......... | H01L 23/3733 257/E23.09 |
| 7,348,665 B2 * | 3/2008 | Sauciuc | ................. | H01L 23/42 257/E23.098 |
| 7,381,592 B2 * | 6/2008 | Yoshimura | .......... | H01L 23/3677 257/E23.101 |
| 9,230,882 B2 * | 1/2016 | Sunaga | ............... | H01L 23/4338 |
| 9,743,558 B2 * | 8/2017 | Bosak | .................. | H01L 23/473 |
| 2001/0004313 A1 | 6/2001 | Yamaoka | | |
| 2002/0159236 A1 | 10/2002 | Ubukata et al. | | |
| 2006/0176672 A1 * | 8/2006 | Kamemoto | .......... | H05K 7/2049 361/714 |
| 2007/0030656 A1 * | 2/2007 | Ross | .................... | H05K 7/2049 361/710 |
| 2008/0186681 A1 * | 8/2008 | Deck | ................... | H01L 23/4006 361/719 |
| 2008/0239678 A1 * | 10/2008 | Ploeg | ..................... | H01L 23/40 361/719 |

* cited by examiner

HEAT SINK, BOARD, ELECTRONIC DEVICE, AND MANUFACTURING METHOD

CROSS-REFERENCE TO RELATED APPLICATIONS

This application is a continuation application of International Patent Application No. PCT/CN2021/075735 filed on Feb. 7, 2021, which claims priority to Chinese Patent Application No. 202010085141.3 filed on Feb. 10, 2020, and claims priority to Chinese Patent Application No. 202010177372.7 filed on Mar. 13, 2020. All of the aforementioned patent applications are hereby incorporated by reference in their entireties.

TECHNICAL FIELD

This application relates to the field of heat dissipation technologies, and in particular, to a heat sink, a board, an electronic device, and a manufacturing method.

BACKGROUND

A chip of an electronic device generates a relatively large amount of heat in a working process. To dissipate heat for the chip of the electronic device, a heat sink is usually mounted on the chip, and the chip dissipates heat to the outside by using the heat sink.

To quickly transfer heat on the chip to the heat sink, a thermally-conductive layer is usually filled between the chip and the heat sink. To avoid a gap between the chip and the heat sink, the thermally-conductive layer filled between the chip and the heat sink has a relatively large thickness.

However, an increase in the thickness of the thermally-conductive layer indicates an increase in thermal resistance of the thermally-conductive layer and a reduction in a heat dissipation effect of the chip.

SUMMARY

Embodiments of this application provide a heat sink, a board, an electronic device, and a manufacturing method, to overcome a problem in a related technology. The technical solutions are as follows.

According to an aspect, a heat sink is provided. The heat sink includes a heat sink fin and a first heat sink plate and a second heat sink plate that are opposite to each other. The heat sink fin is located on the first heat sink plate. The second heat sink plate is flexible. There is an elastic component between the first heat sink plate and the second heat sink plate. The second heat sink plate is configured to come into contact with a heat source component.

In some embodiments, the second heat sink plate is flexible, and can be deformed when being pressed, and the elastic component that can be compressed and extended is further mounted between the first heat sink plate and the second heat sink plate. In this way, when the heat sink is placed on the heat source component, the second heat sink plate of the heat sink is pressed against the heat source component, so that each point on a top surface of the heat source component comes into contact with the second heat sink plate, to avoid a gap between the heat source component and the second heat sink plate and to ensure that the heat source component can continuously transfer heat to the heat sink.

In a possible implementation, the elastic component is one or more of a spring, foam, an elastomer, and foam metal.

In some embodiments, the elastic component may be a spring, and a plurality of springs may be mounted between the first heat sink plate and the second heat sink plate.

In a possible implementation, the second heat sink plate is a metal sheet whose thickness falls within a target range.

The metal sheet may be made of a combination of one or more of copper, aluminum, aluminum alloy, and the like. A material of the metal sheet is not limited in this embodiment provided that heat conduction and heat transfer can be implemented.

In some embodiments, the second heat sink plate is a flexible component that can be deformed, for example, may be a copper sheet with a relatively small thickness. For example, the second heat sink plate may be a thin copper sheet with a thickness of 0.3 millimeters (mm) or 0.5 mm.

In a possible implementation, the heat sink is a vapor chamber (VC) heat sink or a water-cooled heat sink.

In some embodiments, the heat sink may be a VC heat sink, a water-cooled heat sink, or the like.

In a possible implementation, there is closed space between the first heat sink plate and the second heat sink plate, and the closed space includes a thermally-conductive liquid material.

In some embodiments, the first heat sink plate and the second heat sink plate may enclose closed space. The closed space may be referred to as an enclosure of the heat sink, and the enclosure may be filled with a thermally-conductive liquid material, to improve a heat dissipation effect of the heat sink.

According to another aspect, this application further provides a board. The board includes at least one chip, a circuit board, a base, and the foregoing heat sink. The circuit board is located on the base. The at least one chip is located on the circuit board. The heat sink is located on the at least one chip, and the heat sink is fastened on the base. Each chip comes into contact with at least a part of a second heat sink plate of the heat sink.

In some embodiments, the base serves as a support for the board, the circuit board is mounted on the base, the chip may be soldered to the circuit board by using tin, the heat sink is placed on the chip, and the heat sink is fixedly mounted on the base. It may be learned that the heat sink may be always in a state of being pressed against the chip, to ensure good contact between the heat sink and the chip, so that heat on the chip may be continuously transferred to the heat sink and dissipated by using the heat sink.

In a possible implementation, when the second heat sink plate is in an undeformed state, a distance between the second heat sink plate and the circuit board is less than a height of the chip, and a part that is of the second heat sink plate and that comes into contact with the chip is in a pressed and deformed state.

In some embodiments, to enable the second heat sink plate and the chip to be in a state of being pressed against each other, correspondingly, there is chip interference between the second heat sink plate and the circuit board, that is, when the second heat sink plate is in the undeformed state, the distance between the second heat sink plate and the circuit board is less than the height of the chip, so that the part that is of the second heat sink plate and that comes into contact with the chip can be in the pressed and deformed state.

In a possible implementation, a thermally-conductive layer is placed between the second heat sink plate of the heat sink and each chip, so that the second heat sink plate and the chip come into contact with each other through the thermally-conductive layer.

In some embodiments, to accelerate absorption of heat on the chip by the second heat sink plate, correspondingly, the thermally-conductive layer is placed between the second heat sink plate and each chip, so that the second heat sink plate and the chip may be pressed against and come into contact with each other through the thermally-conductive layer.

In a possible implementation, screw holes are disposed at corresponding positions on the first heat sink plate and the second heat sink plate, and an avoidance hole is disposed at a position, on the circuit board, corresponding to the screw hole on the second heat sink plate, and a bolt used to mount the heat sink on the base sequentially passes through the screw hole on the first heat sink plate, the screw hole on the second heat sink plate, and the avoidance hole on the circuit board, and is mounted on the base.

In some embodiments, the heat sink may be mounted on the base by using the bolt. For example, the bolt may sequentially pass through the screw hole on the first heat sink plate, the screw hole on the second heat sink plate, and the avoidance hole on the circuit board, and mounted in a mounting hole on the base. In this way, the heat sink is supported by the base through the bolt, to avoid a case in which damage is caused to the chip because the heat sink is pressed against the chip.

In a possible implementation, the chip is soldered to the circuit board.

In some embodiments, the chip may be mounted on the circuit board, for example, may be soldered to the circuit board by using tin, to ensure that the chip and the circuit board are fastened and to ensure that the chip and the circuit board are electrically connected.

In a possible implementation, an area of the heat sink is greater than an area of the chip.

In some embodiments, the area of the heat sink is much greater than the area of the chip. In this way, although the heat sink is pressed against the chip, a very small part of a weight of the heat sink is pressed against the chip and most of the weight of the heat sink is supported by the base because only a part of the heat sink comes into contact with the chip, and the second heat sink plate of the heat sink is flexible and can be deformed. Therefore, although the heat sink and the chip are in a state of being pressed against each other, no damage is caused to the chip. In this way, the heat sink and the chip are kept in close contact with each other, and a case in which damage is caused to the chip due to pressure is avoided.

According to another aspect, an embodiment of this application further provides an electronic device. The electronic device may include the foregoing board.

According to another aspect, an embodiment of this application further provides a method for manufacturing a heat sink. The method includes mounting a plurality of elastic components on a first surface of a second heat sink plate, where the second heat sink plate is flexible, and a second surface of the second heat sink plate is configured to come into contact with a heat source component, and mounting a first heat sink plate on the second heat sink plate, where the elastic component is located between the first heat sink plate and the second heat sink plate.

In some embodiments, when the heat sink is placed on the heat source component, the second heat sink plate comes into contact with the heat source component, the second heat sink plate may be deformed because the heat sink and the heat source component are pressed against each other, and the elastic component between the first heat sink plate and the second heat sink plate is compressed, to eliminate a gap between the second heat sink plate and the heat source component, so that the second heat sink plate is in close contact with the heat source component, and heat generated by the heat source component can be quickly transferred to the heat sink, to improve a heat dissipation effect of the heat sink and accelerate heat dissipation for the heat source component.

In a possible implementation, the method further includes forming or mounting a plurality of heat sink fins on a surface that is of the first heat sink plate and that faces away from the elastic component.

In some embodiments, for the heat sink, a heat dissipation area of the heat sink may be increased by using the heat sink fin, to improve a heat dissipation effect of the heat sink and accelerate heat dissipation for the heat source component.

According to another aspect, an embodiment of this application further provides a method for manufacturing a board. The method includes mounting a circuit board on a base, and mounting at least one chip on a surface that is of the circuit board and that faces away from the base, and placing the foregoing heat sink on the at least one chip, and fastening the heat sink on the base. Each chip comes into contact with at least a part of a second heat sink plate of the heat sink. The circuit board may be a board.

In some embodiments, in the board obtained by using the method, the second heat sink plate of the heat sink is flexible, the second heat sink plate is deformed because the heat sink and the chip are in a state of being pressed against each other, and an elastic component between the second heat sink plate and a first heat sink plate is compressed, to eliminate a gap between the second heat sink plate and the chip, so that the second heat sink plate is in close contact with the chip, and heat generated by the chip can be quickly transferred to the heat sink, to improve a heat dissipation effect of the heat sink and accelerate heat dissipation for the chip.

In a possible implementation, before placing the foregoing heat sink on the at least one chip, the method further includes placing a thermally-conductive layer on the at least one chip.

In some embodiments, a thermally-conductive layer of a size comparable to that of each chip may be placed on the chip, and then the heat sink is placed on the chip on which there is the thermally-conductive layer. The thermally-conductive layer has a relatively small thickness, and is configured to absorb heat on the chip, and transfer the heat on the chip to the second heat sink plate, to accelerate heat dissipation for the chip.

In some embodiments, the heat sink includes the first heat sink plate and the second heat sink plate that are opposite to each other, and there is the elastic component that can be compressed and extended between the first heat sink plate and the second heat sink plate. When the heat sink is placed on a heat source component such as the chip, the second heat sink plate comes into contact with the heat source component, the second heat sink plate may be deformed because the heat sink and the heat source component are pressed against each other, and the elastic component between the first heat sink plate and the second heat sink plate is compressed, to eliminate a gap between the second heat sink plate and the heat source component, so that the second heat sink plate is in close contact with the heat source component, and heat generated by the heat source component can be quickly transferred to the heat sink, to improve a heat dissipation effect of the heat sink and accelerate heat dissipation for the heat source component.

DESCRIPTION OF EMBODIMENTS

Figure 1:
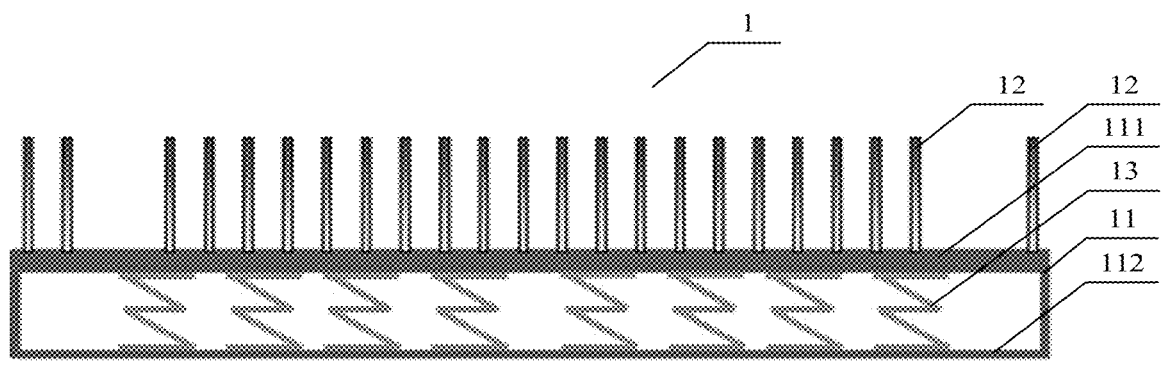
FIG. 1 is a schematic diagram of a structure of a heat sink according to an embodiment of this application.

Reference numerals 1: Heat sink; 2: Chip; 3: Circuit board; and 4: Base; 11: Enclosure; 12: Heat sink fin; and 13: Elastic component; and 111: First heat sink plate; and 112: Second heat sink plate.

An embodiment of this application relates to a heat sink. The heat sink may be a VC heat sink, a water-cooled heat sink, or the like. A type of the heat sink is not limited in this embodiment. The heat sink comes into contact with a heat source component that generates heat, and dissipates heat for the heat source component. For example, the heat sink may come into contact with a chip, and dissipate heat for the chip.

The heat sink 1 may include a heat sink fin 12 and a first heat sink plate 111 and a second heat sink plate 112 that are opposite to each other. The heat sink fin 12 is located on the first heat sink plate 111. The second heat sink plate 112 is flexible. There is an elastic component 13 that can be compressed and extended between the first heat sink plate 111 and the second heat sink plate. The second heat sink plate 112 is configured to come into contact with the heat source component.

The first heat sink plate 111 and the second heat sink plate 112 may enclose closed space. The closed space may include a thermally-conductive liquid material, to improve a heat dissipation effect of the heat sink 1.

In an example, a closed space structure enclosed by the first heat sink plate 111 and the second heat sink plate 112 may be used as an enclosure 11 of the heat sink 1. For example, as shown in FIG. 1, the heat sink 1 includes the enclosure 11 and the heat sink fin 12. The first heat sink plate 111 and the second heat sink plate 112 are two opposite plate surfaces of the enclosure 11. The heat sink fin 12 is located on the first heat sink plate 111. The second heat sink plate 112 is flexible. There is the elastic component 13 between the first heat sink plate 111 and the second heat sink plate 112. The second heat sink plate 112 is configured to come into contact with the chip. In some embodiments, the heat sink fin 12 may be mounted on the first heat sink plate 111. In some other embodiments, the heat sink fin 12 and the first heat sink plate 111 are integrally formed.

The enclosure 11 may be made of metal. For example, the enclosure 11 may be made of copper, aluminum, or aluminum alloy. A material of the enclosure 11 is not limited in this embodiment provided that heat conduction and heat transfer can be implemented.

In an example, the enclosure 11 may include the first heat sink plate 111 and the second heat sink plate 112 that are located opposite to each other and a side wall that connects the first heat sink plate 111 and the second heat sink plate 112. The heat sink fin 12 of the heat sink 1 may be mounted on an outer surface of the first heat sink plate 111. The outer surface is a surface facing away from the inside of the enclosure 11. The heat sink fin 12 is of a sheet-like structure, and is vertically mounted on the first heat sink plate 111. The heat sink fin 12 may increase a heat dissipation area of the heat sink 1, to improve a heat dissipation effect of the heat sink 1.

In an example, the second heat sink plate 112 of the heat sink 1 is configured to come into contact with the heat source component. To keep the second heat sink plate 112 in a state of coming into contact with the heat source component, the second heat sink plate 112 is flexible, and may be deformed when being pressured. For example, the second heat sink plate 112 may be a relatively thin copper sheet, for example, may be a metal sheet whose thickness falls within a target range. For example, the second heat sink plate may be a copper sheet with a thickness of 0.3 mm or 0.5 mm.

The metal sheet may alternatively be an aluminum sheet, an aluminum alloy sheet, or the like. A material of the metal sheet is not limited in this embodiment provided that heat conduction and heat transfer can be implemented.

As shown in FIG. 1, the elastic component 13 is mounted between the first heat sink plate 111 and the second heat sink plate 112 in the enclosure 1. In this way, when the heat sink 1 is pressed against the heat source component, a part that is of the second heat sink plate 112 and that comes into contact with the heat source component is pressed and deformed, so that the heat source component is in close contact with the second heat sink plate 112, and the second heat sink plate 112 and the heat source component are kept in a state of coming into contact with each other, to avoid a gap between the second heat sink plate 112 and the heat source component, so as to improve a heat dissipation effect of the heat sink.

The elastic component 13 located between the first heat sink plate 111 and the second heat sink plate 112 may be one or more of a spring, foam, an elastomer, and foam metal.

For example, as shown in FIG. 1, the elastic component 13 is a spring, and a plurality of springs are mounted between the first heat sink plate 111 and the second heat sink plate 112.

It may be learned from the foregoing description that the second heat sink plate 112 that is of the heat sink 1 and that is configured to come into contact with the heat source component is flexible, and the elastic component 13 is further mounted on the second heat sink plate 112. The elastic component 13 serves as a buffer. The heat sink that serves as a buffer and the heat source component can be always kept in a state of coming into contact with each other, so that heat generated by the heat source component can be transferred to the heat sink in a timely manner and dissipated by using the heat sink, to improve a heat dissipation effect of the heat sink.

In some embodiments, the heat sink includes the enclosure and the heat sink fin, and the enclosure includes the first heat sink plate and the second heat sink plate. The heat sink fin is mounted on the first heat sink plate. The second heat sink plate is flexible. The elastic component that can be compressed and extended is mounted between the first heat sink plate and the second heat sink plate. In this way, when the heat sink is placed on the heat source component, the second heat sink plate comes into contact with the heat source component, the second heat sink plate may be deformed because the heat sink and the heat source component are pressed against each other, and the elastic component in the enclosure is compressed, to eliminate a gap between the second heat sink plate and the heat source component, so that the second heat sink plate is in close contact with the heat source component, and heat generated by the heat source component can be quickly transferred to the heat sink, to improve a heat dissipation effect of the heat sink and accelerate heat dissipation for the heat source component.

In some embodiments, the heat sink 1 includes the first heat sink plate 111 and the second heat sink plate 112 that are opposite to each other, there is the elastic component 13 between the first heat sink plate 111 and the second heat sink plate 112, and the heat sink fin 12 is disposed on the first heat sink plate 111. The elastic component 13 may be a metal elastic component. When the heat sink is placed on the heat source component, the second heat sink plate comes into contact with the heat source component, the second heat sink plate may be deformed because the heat sink and the heat source component are pressed against each other, and the elastic component in the enclosure is compressed, to eliminate a gap between the second heat sink plate and the heat source component, so that the second heat sink plate is in close contact with the heat source component, and heat generated by the heat source component can be quickly transferred to the heat sink, to improve a heat dissipation effect of the heat sink and accelerate heat dissipation for the heat source component.

Figure 2:
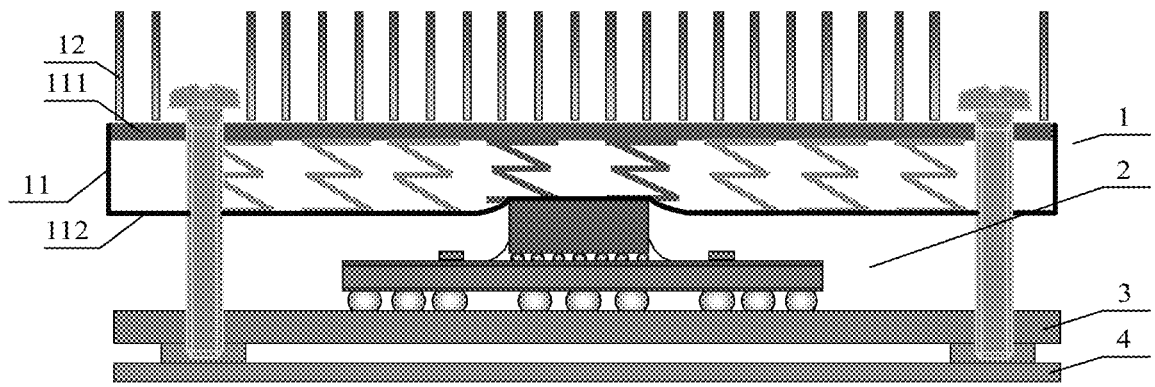
FIG. 2 is a schematic diagram of a structure of a board that includes a heat sink according to an embodiment of this application.

An embodiment of this application further provides a board. The board may be a main control board, a service board, an interface board, or the like of an electronic device. As shown in FIG. 2, the board may include a chip 2, a circuit board 3, a base 4, and the foregoing heat sink 1. The circuit board 3 is mounted on the base 4. The at least one chip 2 is mounted on the circuit board 3. The heat sink 1 is located on the at least one chip 2, and the heat sink 1 is fixedly mounted on the base 4. An area of the heat sink 1 is greater than an area of each chip 2, and each chip 2 comes into contact with a part of a second heat sink plate 112 of the heat sink 1.

The chip 2 is the foregoing heat source component. The circuit board 3 is a printed circuit board (PCB). The base 4 may also be referred to as a front panel, is a fastener, and may be of a plate-like structure.

One heat sink 1 may dissipate heat for one chip 2, or one heat sink 1 may dissipate heat for a plurality of chips 2. This is not limited in this embodiment. For ease of description, an example in which one heat sink 1 dissipates heat for one chip 2 may be used. This is similar to a case in which one heat sink 1 dissipates heat for a plurality of chips 2. Details are not described.

In an example, the circuit board 3 and the base 4 are of a comparable size. For example, an area of the circuit board 3 is equal to an area of the base 4, or an area of the base 4 is slightly greater than an area of the circuit board 3, and the circuit board 3 may be fixedly mounted on the base 4. The chip 2 is mounted on the circuit board 3. For example, the chip 2 may be soldered to the circuit board 3 by using tin. The heat sink 1 is located on the chip 2, and is fixedly mounted on the base 4. In other words, as shown in FIG. 2, the chip 2 is located between the heat sink 1 and the circuit board 3.

As shown in FIG. 2, the area of the chip 2 is much less than the area of the heat sink 1, and the chip 2 comes into contact only with a part of the second heat sink plate 112. When the second heat sink plate 112 is in an undeformed state, a distance between the second heat sink plate 112 and the circuit board 3 is less than a height of the chip 2. In this way, when the chip 2 is located between the heat sink 1 and the circuit board 3, the heat sink 1 is supported by the base 4, and a part that is of the second heat sink plate 112 and that comes into contact with the chip 2 is pressed and deformed. In this way, although the chip 2 is in close contact with the second heat sink plate 112, only a part that is of the heat sink 1 and that comes into contact with the chip 2 and an elastic component on the part exert relatively small pressure on the chip 2, and most of a weight of the heat sink 1 is supported by the base 4. Therefore, the heat sink 1 does not exert excessive pressure on the chip 2. In this way, it is ensured that the second heat sink plate 112 and the chip 2 always come into contact with each other, and no excessive pressure is exerted on the chip 2.

In addition, the second heat sink plate 112 and the chip 2 are pressed against each other, and therefore even if a component in the chip is deformed or even if the board shakes, a state of good contact between the heat sink 1 and the chip 2 can be maintained. In this way, it is ensured that the chip 2 can continuously transfer heat to the heat sink 1, to improve a heat dissipation effect of the chip.

The chip 2 may be a bare chip or a chip that includes an upper cover. In other words, the bare chip that includes no upper cover may be located between the heat sink 1 and the circuit board 3, and the chip that includes an upper cover may be located between the heat sink 1 and the circuit board 3. If the chip 2 is a chip that includes an upper cover, a thermally-conductive layer may be placed between the bare chip and the upper cover. The thermally-conductive layer may be made of a resilient material.

To accelerate heat transfer between the second heat sink plate 112 and the chip 2, correspondingly, a thermally-conductive layer is placed between the second heat sink plate 112 and each chip 2, so that the second heat sink plate 112 and the chip 2 come into contact with each other through the thermally-conductive layer.

The thermally-conductive layer located between the second heat sink plate 112 and the chip 2 may be a gel-like material that can be cured.

In an example, functions of the thermally-conductive layer are to absorb heat on the chip 2, and transfer the heat on the chip 2 to the second heat sink plate 112. The thermally-conductive layer has a relatively small thickness. In a related technology, a thermally-conductive layer is also disposed between a heat sink and a chip, but the thermally-conductive layer has a relatively large thickness. A function of the thermally-conductive layer is to fill a gap between the heat sink and the chip, to avoid a case in which a heat dissipation effect is affected because a void is generated between the heat sink and the chip. However, in this application, the thermally-conductive layer between the heat sink 1 and the chip 2 has a relatively small thickness, only plays a heat transfer role, and is not used to fill a gap. This is because the heat sink in this application serves as a buffer, the second heat sink plate is flexible, and an enclosure includes an elastic component that can be compressed and extended. In this way, the heat sink and the chip can be kept in a state of being pressed against each other, and an assembly tolerance between the heat sink and the chip can be absorbed, to eliminate a gap between the heat sink and the chip, so that the heat sink and the chip are kept in a state of being in close contact with each other.

As described above, the heat sink 1 is fixedly mounted on the base 4, and the heat sink 1 may be mounted on the base 4 by using a bolt. For example, as shown in FIG. 2, screw holes are disposed at corresponding positions on a first heat sink plate 111 and the second heat sink plate 112, and an avoidance hole is disposed at a position, on the circuit board 3, corresponding to the screw hole on the second heat sink plate 112, and the bolt used to mount the heat sink 1 on the base 4 sequentially passes through the screw hole on the first heat sink plate 111, the screw hole on the second heat sink plate 112, and the avoidance hole on the circuit board 3, and is mounted on the base 4.

In an example, four edges of the heat sink 1 may be separately mounted on the base 4 by using the bolt. For example, the screw holes may be respectively disposed at the corresponding positions on the first heat sink plate 111 and the second heat sink plate 112 of the heat sink 1, the avoidance hole may be disposed on the circuit board 3 mounted on the base 4, and a mounting hole may be disposed on the base 4. The mounting hole may be a screw hole, a projection welding nut, or the like. In this way, the bolt sequentially passes through the screw hole on the first heat sink plate 111, the screw hole on the second heat sink plate 112, and the avoidance hole on the circuit board 3, and is mounted in the mounting hole on the base 4, to mount the heat sink 1 on the base 4.

In this way, the heat sink 1 is mounted on the base 4 by using the bolt, and most of the weight of the heat sink 1 is supported by the base 4. Although the second heat sink plate 112 and the chip 2 are pressed against each other, the heat sink 1 exerts relatively small pressure on the chip 2 and no damage is caused to the chip 2 because the second heat sink plate 112 of the heat sink 1 is flexible.

In some embodiments, the board includes the heat sink, the chip, the circuit board, and the base. The circuit board is mounted on the base. The chip is mounted on the circuit board. The heat sink is located on the chip and fixedly mounted on the base. The second heat sink plate that is of the heat sink and that comes into contact with the chip is flexible, and the elastic component that can be compressed and extended is further mounted on the second heat sink plate, so that the heat sink and the chip can be kept in a state of being pressed against each other, to eliminate a gap between the heat sink and the chip, and the heat sink and the chip are kept in a state of being in close contact with each other. In this way, heat generated by the chip can be quickly transferred to the heat sink, to improve a heat dissipation effect of the heat sink and accelerate heat dissipation for the chip.

An embodiment of this application further provides an electronic device. The electronic device may be a communications device, a multimedia device, or the like, and may include the foregoing board. As described above, the board includes a heat sink, a chip, a circuit board, and a base. The circuit board is mounted on the base. The chip is mounted on the circuit board. The heat sink is located on the chip and fixedly mounted on the base. A second heat sink plate that is of the heat sink and that comes into contact with the chip is flexible, and an elastic component that can be compressed and extended is further mounted on the second heat sink plate, so that the heat sink and the chip can be kept in a state of being pressed against each other, to eliminate a gap between the heat sink and the chip. In this way, heat generated by the chip can be quickly transferred to the heat sink, to improve a heat dissipation effect of the heat sink and accelerate heat dissipation for the chip.

An embodiment of this application further provides a method for manufacturing a heat sink. The method may include mounting a plurality of elastic components 13 on a first surface of a second heat sink plate 112, where the second heat sink plate 112 is flexible, and a second surface of the second heat sink plate 112 is configured to come into contact with a heat source component, and mounting a first heat sink plate 111 on the second heat sink plate 112, where the elastic component 13 is located between the first heat sink plate 111 and the second heat sink plate 112.

The first surface and the second surface of the second heat sink plate 112 are opposite to each other. The first heat sink plate 111 and the second heat sink plate 112 may enclose closed space, namely, an enclosure 11. The enclosure 11 may include a thermally-conductive material.

In an example, when the heat sink is placed on the heat source component, the second heat sink plate 112 comes into contact with the heat source component, the second heat sink plate may be deformed because the heat sink and the heat source component are pressed against each other, and the elastic component in the enclosure is compressed, to eliminate a gap between the second heat sink plate and the heat source component, so that the second heat sink plate is in close contact with the heat source component, and heat generated by the heat source component can be quickly transferred to the heat sink, to improve a heat dissipation effect of the heat sink and accelerate heat dissipation for the heat source component.

In an example, the method may further include mounting a plurality of heat sink fins 12 on a surface that is of the first heat sink plate 111 and that faces away from the elastic component 13. For the heat sink, a heat dissipation area of the heat sink 1 may be increased by using the heat sink fin 12, to improve a heat dissipation effect of the heat sink 1.

An embodiment of this application further provides a method for manufacturing a board. The method may include mounting a circuit board 3 on a base 4, and mounting at least one chip 2 on a surface that is of the circuit board 3 and that faces away from the base 4, and placing the foregoing heat sink 1 on the at least one chip 2, and fastening the heat sink 1 on the base 4. Each chip 2 comes into contact with at least a part of a second heat sink plate of the heat sink 1.

When the second heat sink plate 112 is in an undeformed state, a distance between the second heat sink plate 112 and the circuit board 3 is less than a height of the chip 2, so that a part that is of the second heat sink plate 112 and that comes into contact with the chip 2 is in a pressed and deformed state.

The heat sink 1 may be fastened on the base 4 by using a bolt. The chip 2 may be soldered to the circuit board 3 by using tin. A manner of fastening the heat sink 1 on the base 4 and a manner of mounting the chip 2 on the circuit board 3 are used as examples. The manner of fastening the heat sink 1 on the base 4 and the manner of mounting the chip 2 on the circuit board 3 are not limited in this embodiment.

In the board obtained by using the manufacturing method, the second heat sink plate 112 of the heat sink 1 is flexible, the second heat sink plate 112 is deformed because the heat sink 1 and the chip 2 are in a state of being pressed against each other, and an elastic component 13 between the second heat sink plate 112 and a first heat sink plate 111 is compressed, to eliminate a gap between the second heat sink plate 112 and the chip 2, so that the second heat sink plate 112 is in close contact with the chip 2, and heat generated by the chip 2 can be quickly transferred to the heat sink 1, to improve a heat dissipation effect of the heat sink 1 and accelerate heat dissipation for the chip.

In an example, before placing the foregoing heat sink 1 on the at least one chip 2, the method further includes placing a thermally-conductive layer on the at least one chip 2. For example, a thermally-conductive layer of a size comparable to that of each chip 2 may be placed on the chip 2, and then the heat sink 1 is placed on the chip 2 on which there is the thermally-conductive layer. The thermally-conductive layer has a relatively small thickness, and is configured to absorb heat on the chip 2, and transfer the heat on the chip 2 to the second heat sink plate 112, to accelerate heat dissipation for the chip 2.

In some embodiments, the heat sink includes the first heat sink plate and the second heat sink plate that are opposite to each other, and there is the elastic component that can be compressed and extended between the first heat sink plate and the second heat sink plate. When the heat sink is placed on a heat source component such as the chip, the second heat sink plate comes into contact with the heat source component, the second heat sink plate may be deformed because the heat sink and the heat source component are pressed against each other, and the elastic component between the first heat sink plate and the second heat sink plate is compressed, to eliminate a gap between the second heat sink plate and the heat source component, so that the second heat sink plate is in close contact with the heat source component, and heat generated by the heat source component can be quickly transferred to the heat sink, to improve a heat dissipation effect of the heat sink and accelerate heat dissipation for the heat source component.

The foregoing descriptions are merely an embodiment of this application, but are not intended to limit this application. Any modification, equivalent replacement, or improvement made without departing from the spirit and principle of this application should fall within the protection scope of this application.

What is claimed is:

1. A heat sink comprising:
   a first heat sink plate;
   a heat sink fin located on the first heat sink plate;
   a second heat sink plate that is flexible, disposed opposite to the first heat sink plate, and configured to be in contact with a heat source component; and
   an elastic component disposed between the first heat sink plate and the second heat sink plate, wherein the first heat sink plate is coupled to the second heat sink plate to form an enclosure that is disposed between the first heat sink plate and the second heat sink plate, and wherein the elastic component is disposed in the enclosure.

2. The heat sink of claim 1, wherein the elastic component is one of a spring, a foam, an elastomer, or a foam metal.

3. The heat sink of claim 1, wherein the second heat sink plate is a metal sheet comprising a thickness that falls within a target range of about 0.3 millimeters (mm) to about 0.5 mm.

4. The heat sink of claim 1, wherein the heat sink is a vapor chamber (VC) heat sink or a water-cooled heat sink.

5. The heat sink of claim 1, further comprising wherein the enclosure forms a closed space between the first heat sink plate and the second heat sink plate, wherein the closed space comprises a thermally-conductive liquid material.

6. A board comprising:
   a base;
   a circuit board located on the base;
   at least one chip located on the circuit board;
   a heat sink located on the at least one chip, fastened on the base, and comprising:
      a first heat sink plate;
      a heat sink fin located on the first heat sink plate;
      a second heat sink plate that is flexible, disposed opposite to the first heat sink plate, and configured to be in contact with a heat source component; and
      an elastic component disposed between the first heat sink plate and the second heat sink plate, wherein the first heat sink plate is coupled to the second heat sink plate to form an enclosure that is disposed between the first heat sink plate and the second heat sink plate,
   wherein the elastic component is disposed in the enclosure, and
   wherein each of the at least one chip is configured to be in contact with a part of the second heat sink plate.

7. The board of claim 6, wherein the second heat sink plate is configured to be in an undeformed state, wherein a distance between the second heat sink plate and the circuit board is less than a height of the chip, and wherein the part is configured to be in a pressed and deformed state.

8. The board of claim 6, further comprising a thermally-conductive layer disposed between the second heat sink plate and each of the at least one chip to make the second heat sink plate and the at least one chip be in contact with each other through the thermally-conductive layer.

9. The board of claim 6, further comprising:
   a first screw hole disposed at a first position on the first heat sink plate;
   a second screw hole disposed at a second position on the second heat sink plate;
   an avoidance hole disposed at a third position, on the circuit board, corresponding to the second screw hole; and
   a bolt sequentially passing through the first screw hole, the second screw hole, and the avoidance hole, mounted on the base, and configured to mount the heat sink on the base.

10. The board of claim 6, wherein the at least one chip is soldered to the circuit board.

11. The board of claim 6, wherein a first area of the heat sink is greater than a second area of the at least one chip.

12. The board of claim 6, wherein the elastic component is one of a spring, a foam, an elastomer, or a foam metal.

13. The board of claim 6, wherein the second heat sink plate is a metal sheet comprising a thickness that falls within a target range of about 0.3 millimeters (mm) to about 0.5 mm.

14. The board of claim 6, wherein the heat sink is either a vapor chamber (VC) heat sink or a water-cooled heat sink.

15. The board of claim 6, wherein the enclosure forms a closed space that is disposed between the first heat sink plate and the second heat sink plate, and wherein the closed space comprises a thermally-conductive liquid material.

16. An electronic device comprising:
   a base;
   a circuit board located on the base;
   at least one chip located on the circuit board; and
   a heat sink located on the at least one chip and comprising:
      a first heat sink plate;
      a heat sink fin located on the first heat sink plate; and
      a second heat sink plate that is flexible, disposed opposite to the first heat sink plate, and in contact with a heat source component, wherein the at least one chip is in contact with a part of the second heat sink plate; and
      an elastic component disposed between the first heat sink plate and the second heat sink plate, wherein the first heat sink plate is coupled to the second heat sink plate to form an enclosure that is disposed between the first heat sink plate and the second heat sink plate, and wherein the elastic component is disposed in the enclosure.

17. The electronic device of claim 16, wherein the second heat sink plate is configured to be in an undeformed state, wherein a distance between the second heat sink plate and the circuit board is less than a height of the at least one chip, and wherein the part is configured to be in a pressed and deformed state.

18. The electronic device of claim 16, further comprising a thermally-conductive layer disposed between the second heat sink plate and each of the at least one chip to make the second heat sink plate and the at least one chip be in contact with each other through the thermally-conductive layer.

19. The electronic device of claim 16, further comprising:
  a first screw hole disposed at a first position on the first heat sink plate;
  a second screw hole disposed at a second position on the second heat sink plate;
  an avoidance hole disposed at a third position, on the circuit board, corresponding to the second screw hole; and
  a bolt to mount the heat sink on the base, wherein the bolt sequentially passes through the first screw hole, through the second screw hole, through the avoidance hole, and is mounted on the base.

20. The electronic device of claim 16, wherein the enclosure forms a closed space that is disposed between the first heat sink plate and the second heat sink plate, and wherein the closed space comprises a thermally-conductive liquid material.

\* \* \* \* \*